(12) United States Patent
Xiao (10) Patent No.: US 8,859,354 B2
(45) Date of Patent: Oct. 14, 2014

(54) TRANSISTORS AND FABRICATION METHOD THEREOF

(71) Applicant: Semiconductor Manufacturing International Corp., Shanghai (CN)

(72) Inventor: Deyuan Xiao, Shanghai (CN)

(73) Assignee: Semiconductor Manufacturing International Corp, Shanghai (CN)

( * ) Notice: Subject to any disclaimer, the term of this patent is extended or adjusted under 35 U.S.C. 154(b) by 28 days.

(21) Appl. No.: 13/831,995

(22) Filed: Mar. 15, 2013

(65) Prior Publication Data

US 2014/0151637 A1    Jun. 5, 2014

(30) Foreign Application Priority Data

Dec. 4, 2012    (CN) .......................... 2012 1 0514533

(51) Int. Cl.
| | |
|---|---|
| *H01L 21/338* | (2006.01) |
| *H01L 21/337* | (2006.01) |
| *H01L 29/06* | (2006.01) |
| *H01L 29/732* | (2006.01) |
| *H01L 29/66* | (2006.01) |
| *H01L 29/778* | (2006.01) |

(52) U.S. Cl.
CPC ........ *H01L 29/66431* (2013.01); *H01L 29/778* (2013.01)
USPC ........... 438/167; 438/172; 438/183; 438/191; 438/572; 257/12; 257/14; 257/183; 257/187

(58) Field of Classification Search
CPC ............ H01L 29/66462; H01L 29/802; H01L 29/66318; H01L 29/66431; H01L 29/7782; H01L 29/778; H01L 29/267
USPC ............... 438/46, 47, 94, 167, 172, 183, 191, 438/483, 572, 590; 257/12, 14, 183, 187, 257/192, 200
See application file for complete search history.

(56) References Cited

U.S. PATENT DOCUMENTS

| | | | | |
|---|---|---|---|---|
| 6,399,970 | B2 * | 6/2002 | Kubo et al. .................... | 257/194 |
| 6,674,150 | B2 * | 1/2004 | Takagi et al. .................. | 257/593 |
| 7,863,625 | B2 * | 1/2011 | Bratkovski et al. ............. | 257/80 |
| 2010/0084687 | A1 | 4/2010 | Chen et al. | |

\* cited by examiner

*Primary Examiner* — Hsien Ming Lee
(74) *Attorney, Agent, or Firm* — Anova Law Group, PLLC (57) ABSTRACT

A method is provided for fabricating a transistor. The method includes providing a semiconductor substrate, and forming a quantum well layer on the semiconductor substrate. The method also includes forming a potential energy barrier layer on the semiconductor substrate, and forming an isolation structure to isolate different transistor regions. Further, the method includes patterning the transistor region to form trenches by removing portions of the quantum well layer and the potential energy barrier layer corresponding to a source region and a drain region, and filling trenches with a semiconductor material to form a source and a drain. Further, the method also includes forming a gate structure on a portion of the quantum well layer and the potential energy barrier layer corresponding to a gate region.

19 Claims, 6 Drawing Sheets

TRANSISTORS AND FABRICATION METHOD THEREOF

CROSS-REFERENCES TO RELATED APPLICATIONS

This application claims the priority of Chinese patent application No. 201210514533.2, filed on Dec. 4, 2012, the entirety of which is incorporated herein by reference.

FIELD OF THE INVENTION

The present invention generally relates to the field of semiconductor manufacturing technology and, more particularly, relates to transistors and fabrication techniques.

BACKGROUND

With rapid development on semiconductor technology, performance requirements of transistors have been continually increased. In order to fabricate transistors with an ultrahigh frequency and an ultrahigh speed, a high electron mobility transistor (HEMT) technology has been developed. The ultrahigh frequency and the ultrahigh speed of a transistor may be achieved by increasing the carrier mobility to reduce the delay time of the signal transfer.

Figure 1:
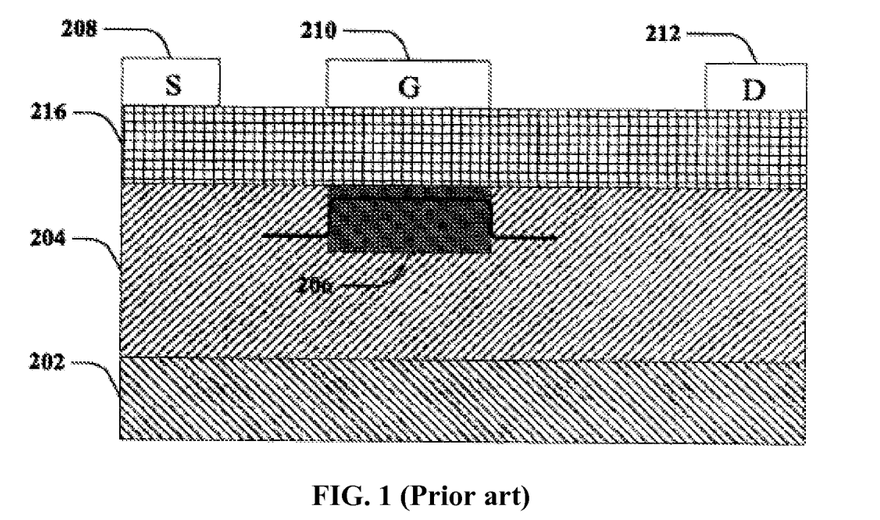
FIG. 1 illustrates an existing high electron mobility transistor.

FIG. 1 illustrates an existing HEMT. The HEMT includes: a sapphire substrate 202; a gallium nitride (GaN) layer 204 on the sapphire substrate 202; an aluminum gallium nitride (AlGaN) layer 216 on the GaN layer 204 serving as potential energy barrier layer; a gate 210 on the AlGaN layer 216; and a source region 208 and a drain region 212 on the AlGaN layer 216 at both sides of the gate 210. The GaN layer 204 and the AlGaN 216 form a modulation doped heterojunction. A two dimensional electron gas (2-DEG) is formed between the GaN layer 204 and the AlGaN layer 216. A surface intensity of a 2-DEG may be controlled by the gate voltage $V_g$, thus the working current of the transistor may be controlled. Because 2-DEG may not be affected by the scattering of ionized impurities, it may has a relatively high carrier mobility.

Further, referring to FIG. 1, a fluoride ion layer 206 may be formed in the GaN layer 204 under the gate 210, a breakdown problem may be solved by locally increasing the potential energy of the GaN layer 204.

However, existing techniques may be unable to match the carrier mobility requirements of the continuous development of the semiconductor technology. The disclosed methods and systems are directed to solve one or more problems set forth above and other problems.

BRIEF SUMMARY OF THE DISCLOSURE

One aspect of the present disclosure includes a method for fabricating a transistor. The method includes providing a semiconductor substrate, and forming a quantum well layer on the semiconductor substrate. The method also includes forming a potential energy barrier layer on the semiconductor substrate, and forming an isolation structure to isolate different transistor regions. Further, the method includes patterning the transistor region to form trenches by removing portions of the quantum well layer and the potential energy barrier layer corresponding to a source region and a drain region, and filling trenches with a semiconductor material to form a source and a drain. Further, the method also includes forming a gate structure on a portion of the quantum well layer and the potential energy barrier layer corresponding to a gate region.

Another aspect of the present disclosure includes a transistor. The transistor includes a semiconductor substrate having an isolation structure isolating different transistor regions, and a quantum well layer on the semiconductor substrate in one transistor region. The transistor also includes a potential energy barrier layer on the quantum well layer and a gate structure on the potential energy barrier layer. Further, the transistor includes a source and a drain on the semiconductor substrate at both sides of the gate structure connecting with the quantum well layer and the potential energy barrier layer.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 9:
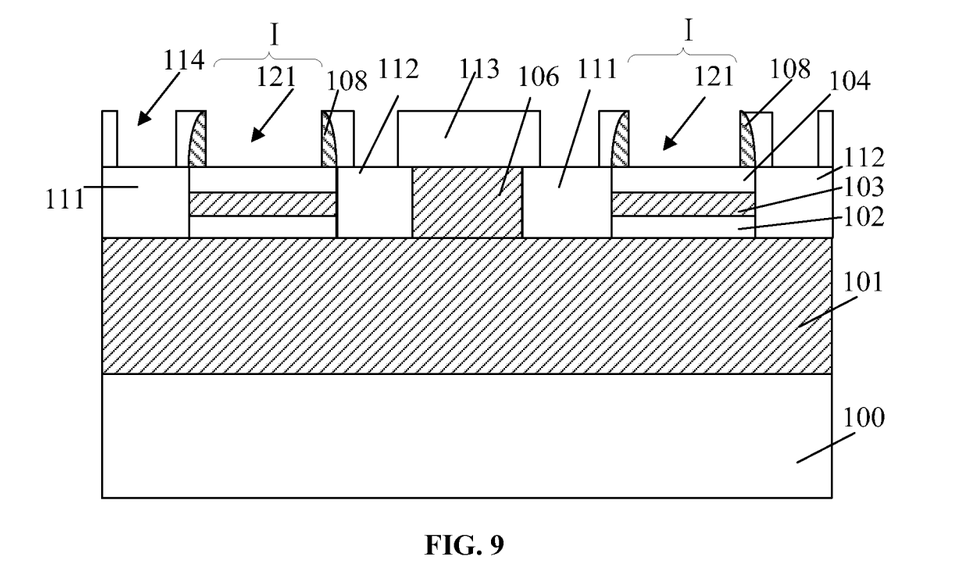
Figure 10:
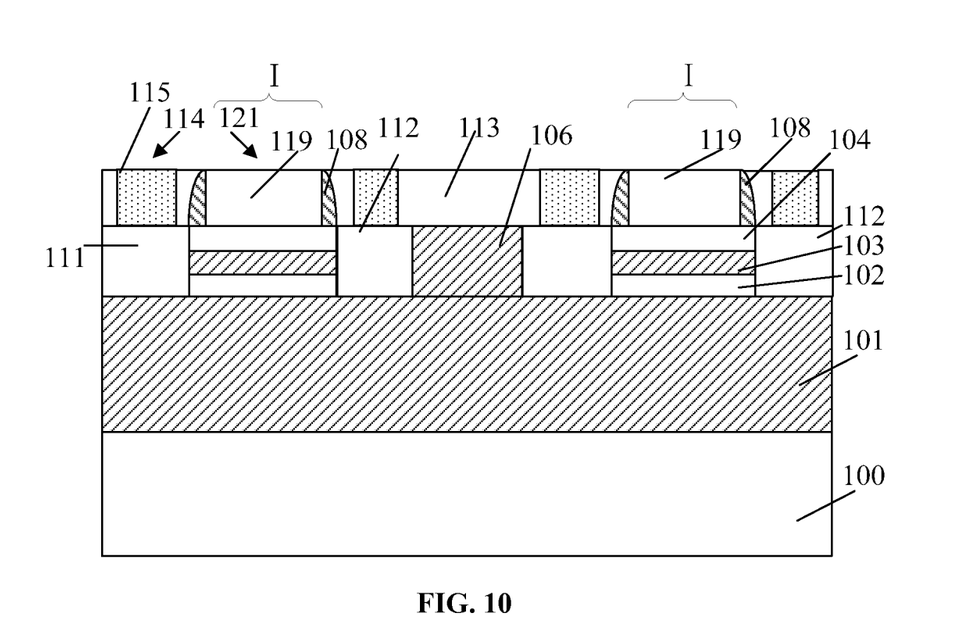
Figure 11:
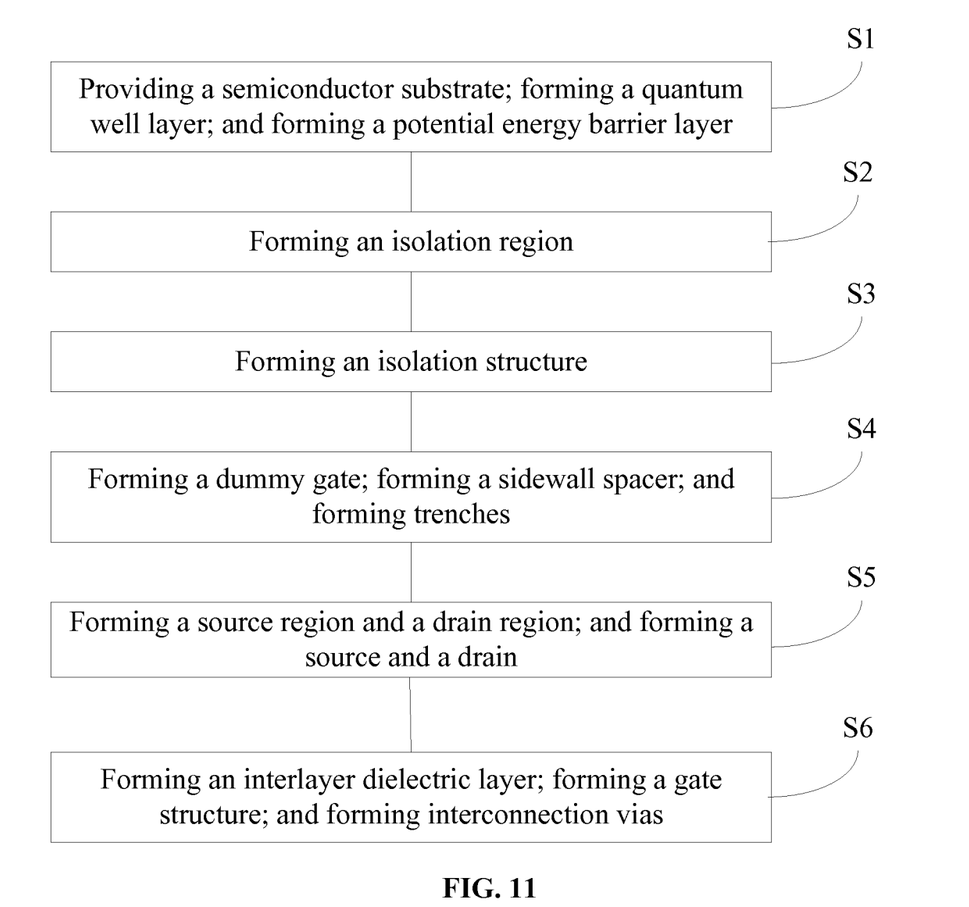
FIG. 11 illustrates an exemplary fabrication process for a high electron mobility transistor consistent with the disclosed embodiments.

FIG. 11 illustrates an exemplary fabrication process for a high electron mobility transistor consistent with the disclosed embodiments; and FIGS. 2-10 illustrate semiconductor structures corresponding to certain stages of the exemplary fabrication process.

Figure 2:
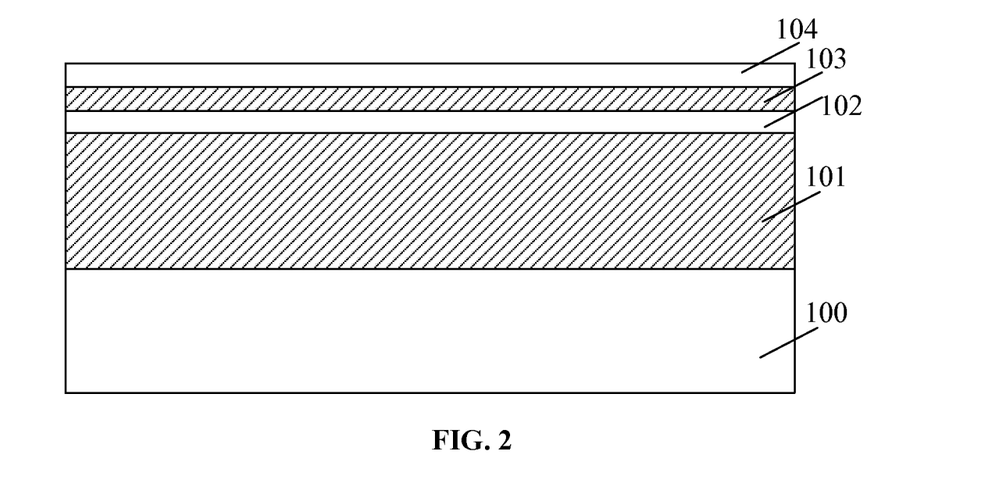
FIGS. 2-10 illustrate semiconductor structures corresponding to certain stages of an exemplary fabrication process for a high electron mobility transistor.

As shown in FIG. 11, at the beginning of the fabrication process, a semiconductor substrate with certain structures is provided (S1). FIG. 2 illustrates a corresponding semiconductor structure.

As shown in FIG. 2, a semiconductor substrate 100 is provided. The semiconductor substrate may sequentially have: a thermal conductive and electrical isolation buffer layer 101, a quantum well layer 102, a potential energy barrier layer 103, and a capping layer 104 on one surface. Certain layer(s) may be omitted and other layer(s) may be included.

The semiconductor substrate 100 may include any appropriate type of semiconductor material, such as single crystal silicon, poly silicon, amorphous silicon, silicon germanium, carborundum, indium antimonide, lead telluride, indium arsenide, indium phosphide, gallium arsenide, gallium antimonide, alloy semiconductor, epitaxially grown materials and/or silicon on insulator (SOI). In one embodiment, the semiconductor substrate 100 is silicon with a (111) crystal surface. The semiconductor substrate 100 may also provide a base for subsequent processes and structures After providing the semiconductor substrate 100, the thermal conductive and electrical isolation buffer layer 101, which may be referred as a buffer layer, may be formed on the semiconductor substrate 100. The buffer layer 101 may be in between the semiconductor substrate 100 and the quantum well layer 102. The buffer layer 101 may have a better lattice match with the quantum well layer 102 than the semiconductor substrate 100, thus the quality of the quantum well layer 102 may be improved.

The buffer layer 101 may also electrically isolate subsequently formed transistors from the semiconductor substrate 100. Further, the buffer layer 101 may have a good thermal conductivity, thus it may timely transfer heat generated by a working transistor to outside, and the stability of the transistor may be improved.

The buffer layer 101 may be made of any appropriate material, such as aluminum nitride (AlN), or aluminum arsenate (AlAs), etc. Various methods may be used to form the buffer layer 101, such as a metal organic chemical vapor deposition (MOCVD) process, an atomic layer deposition (ALD) process, a molecular beam epitaxy (MBE) process, or a physical vapor deposition process, etc. In one embodiment, the buffer layer 101 is AlN. A thermal conductivity coefficient of AlN is approximately 3.4 W/cm·K, which may be two order of magnitudes higher than conventional isolation materials such as implanted AlN, etc. Therefore, the heat generated by the working transistor may be timely transferred to outside, and the working temperature of a transistor may be lowered.

A thickness of the buffer layer 101 may have impacts on certain aspects of the transistor. If the thickness of the buffer layer 101 is too small, the buffer layer 101 may be relatively-largely affected by crystal lattices of the semiconductor substrate 100, a good crystal lattice match with the quantum well layer 102 may be unable to be obtained. If the thickness of the buffer layer 101 is too big, it may be easy to waste materials. In one embodiment, the thickness of the buffer layer 101 may be in a range of approximately 1 μm~2 μm.

Referring to FIG. 2, after forming the buffer layer 101, the quantum well layer 102 may be formed on the buffer layer 101. The quantum well layer 102 may include a gallium nitride (GaN) quantum well layer, an indium gallium nitride (InGaN) quantum well layer, a germanium quantum well layer, a gallium arsenide (GaAs) quantum well layer, an aluminum gallium arsenide (AlGaAs) quantum well layer, a germanium quantum well layer, or an aluminum gallium nitride (AlGaN) quantum well layer, etc. Various processes may be used to form the quantum well layer 102, such as a metal organic chemical vapor deposition (MOCVD) process, an atomic layer deposition (ALD) process, a molecular beam epitaxy (MBE) process, or a physical vapor deposition process, etc.

Further, after forming the quantum well layer 102, the potential energy barrier layer 103 may be formed on the quantum well layer 102. The potential energy barrier layer 103 may be made of any appropriate material, such as aluminum nitride (AlN), aluminum arsenide (AlAs), or silicon nitride (SiN), etc. In one embodiment, the potential energy barrier layer 103 is made of AlN. Various processes may be used to form the potential energy barrier layer 103, such as a metal organic chemical vapor deposition (MOCVD) process, an atomic layer deposition (ALD) process, a molecular beam epitaxy (MBE) process, or a physical vapor deposition (PVD) process, etc.

In one embodiment, the potential energy barrier layer 103 is AlN. The quantum well layer 102 is one of GaN, InGaN, and AlGaN. AlN may have a relative large band gap of approximately 6.2 eV. GaN, InGaN, and AlGaN may have a relatively small band gap in a range of approximately 3 eV~4 eV. When the quantum well layer 102 and the potential energy barrier layer 103 contact, a two-dimensional electron gas (2-DEG) may be formed at the interface because of a band gap difference. Specifically, the quantum well layer 102 made of one of GaN, InGaN, and AlGaN has relatively small band gap than the potential energy barrier layer 103 made of AlN, the potential energy barrier layer 103 may have a quantum confinement effect on the quantum well layer 102, the 2-DEG may be effectively controlled in the quantum well layer 102. With similar preconditions, a surface charge density of the 2-DEG in a transistor having the quantum well layer 102 may be relatively high, and a carrier mobility of the transistor may be enhanced.

The quantum well layer 102 made of InGaN may be more suitable for transistors having a fast processing speed because InGaN has a relative small band gap than AlGaN. The quantum well layer 102 made of AlGaN may be more suitable for transistors requiring a high breakdown voltage because AlGaN has a relatively large band gap.

A thickness of the potential energy barrier layer 103 may have impacts on certain aspects of transistors. If the thickness of the potential energy barrier layer 103 is too small, it may affect the band gap. If the thickness of the potential energy barrier layer 103 is too large, it may be easy to waste materials. In one embodiment, the thickness of the potential energy barrier layer 103 is in a range of approximately 1 nm~5 nm.

A thickness of the quantum well layer 102 may have impacts on certain aspects of transistors. If the thickness of the quantum well layer 102 is too small, it may be unable to obtain a high quality quantum well structure. If the thickness of the quantum well layer 102 is too large, it may be easy to waste materials. In one embodiment, the thickness of the quantum well layer 102 is in a range of approximately 10 nm~50 nm.

Further, referring to FIG. 2, after forming the potential energy barrier layer 103, the capping layer 104 may be formed on the potential energy barrier layer 103. The capping layer 104 may be used to protect the potential energy barrier layer 103 and the quantum well layer 102, and prevent the potential energy barrier layer 103 and the quantum well layer 102 from being damaged by subsequent processes.

The capping layer 104 may be made of any appropriate material, such as GaN, AlGaN, or GaAs, etc. Various processes may be used to form the capping layer 104, such as a MOCVD process, an ALD process, or an MBE process, etc.

A thickness of the capping layer 104 may have impacts on certain aspects of the transistors. If the thickness of the capping layer 104 is too small, the capping layer 104 may be unable to protect the quantum well layer 102 and the potential energy barrier layer 103. If the thickness of the capping layer 104 is too big, it may easy to waste materials. In one embodiment, the thickness of the capping layer 104 may be in a range of approximately 1 nm~3 nm.

Figure 3:
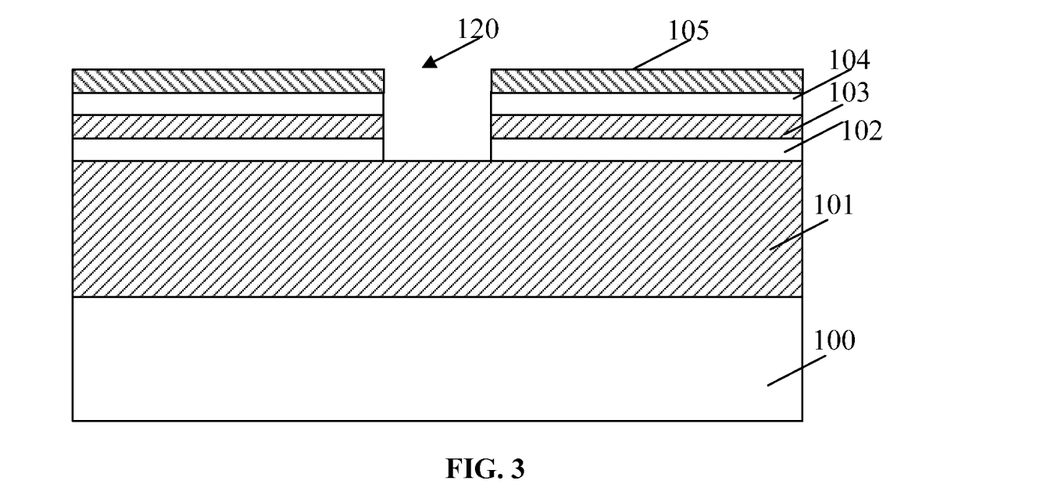

Returning to FIG. 11, after forming the capping layer 104, an isolation region may be formed by patterning the capping layer 104, the potential energy barrier layer 103, and the quantum well layer 102 (S2). FIG. 3 illustrates a corresponding semiconductor structure.

As shown in FIG. 2, an isolation region 120 is formed by etching through the capping layer 104, the potential energy layer 103 and the quantum well layer 102. A portion of one surface of the buffer layer 101 may be exposed. The isolation region 120 may be a shallow trench which may be used to subsequently form a shallow trench isolation (STI) structure.

The isolation region 120 may be formed by any appropriate process, such as a dry etching process including a plasma etching process or an ion beam etching process, or a wet etching process, etc. In one embodiment, the isolation region 120 is formed by an inductive coupling plasma etching (ICP) process. Specifically, a mask layer 105 having patterns of the isolation region 120 may be formed on the capping layer 104, then an ICP process may be used to etching the capping layer 104, the potential energy barrier layer 103, and the quantum well layer 102 to form the isolation region 120. The ICP process may be stopped when a portion of the surface of the buffer layer 101 is exposed.

The mask layer 105 may be made of different materials, such as silicon nitride, silicon oxide, or photo resist etc. In one embodiment, the mask layer 105 is silicon nitride, which may refer as a hard mask layer. Various processes may be used to form the mask layer, such as a chemical vapor deposition process, a physical vapor deposition process, or a spin-coating process, etc.

Figure 4:
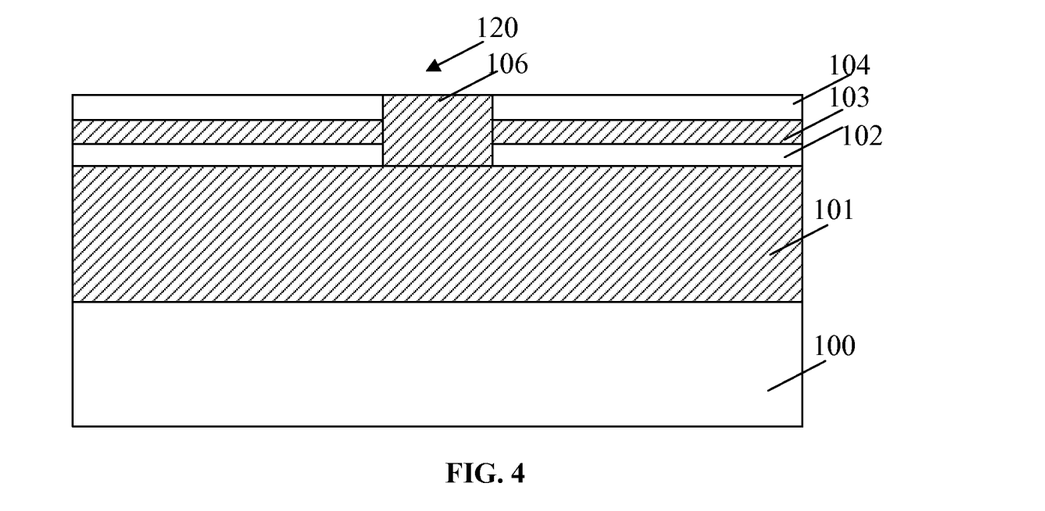

Returning to FIG. 11, after forming the isolation region 120, an isolation structure may be formed by filling the isolation region 120 (S3). FIG. 4 illustrates a corresponding semiconductor structure.

As shown in FIG. 4, an isolation structure 106 is formed inside the isolation region 120. For illustrative purposes, only one isolation structure 106 is shown, and only two transistor regions isolated by the isolation structure 106 are shown, there may be a plurality of isolation structures and transistor regions.

The isolation structure 106 may be made of any appropriate material, such as silicon oxide, silicon nitride, silicon oxynitride, AlN, or AlAs, etc. In one embodiment, a material for the isolation structure 106 may be similar as the buffer layer 101. Thus, material types may be reduced, and material cost may be lowered.

Various processes may be used to form the isolation structure 106, such as a chemical vapor deposition (CVD) process, a physical vapor deposition (PVD) process, a selective epitaxial process, or a flowable chemical vapor deposition (FCVD) process, etc. In one embodiment, the isolation structure 106 may be formed by a selective epitaxial process, because the buffer layer 101 may be exposed by the isolation region 120, the isolation structure 106 formed by the selective epitaxial process may have a dense connection with the buffer layer 101. Therefore, heat generated by the working transistor at the isolation structure 106 may be timely transferred to outside.

Further, after forming the isolation structure 106, the mask layer 105 may be removed. Various methods may be used to remove the mask layer 105, such as a chemical etching process, a plasma etching process, or a chemical mechanical polishing process. In one embodiment, a chemical etching process may be used to remove the mask layer 105 if the mask layer 105 is a hard mask layer.

Figure 5:
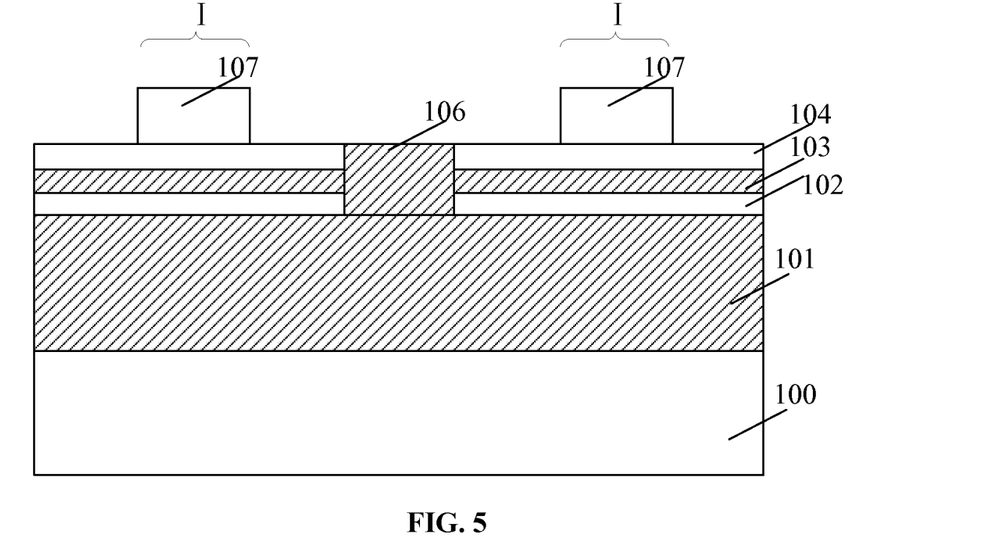

Returning to FIG. 11, after forming the isolation structure 106, a dummy gate may be formed on the capping layer 104 (S4). FIG. 5 illustrates a corresponding semiconductor structure.

As shown in FIG. 5, a dummy gate 107 is formed on each of regions "I" of the capping layer 104 isolated by the isolation structure 106. The region "I" may refer as a gate region of a transistor. The dummy gate 107 may be made of any appropriate material, such as poly silicon, silicon oxide, silicon nitride, silicon oxynitride, or photo resist, etc. In one embodiment, the dummy gate is made of poly silicon.

Various methods may be used to form the dummy gate 107. In one embodiment, the method for forming the dummy gate 107 may include sequentially: forming a poly silicon layer on the capping layer, and patterning the poly silicon to form the dummy gate 107. The poly silicon may be patterned by a dry etching process, or a wet chemical process, etc.

Figure 6:
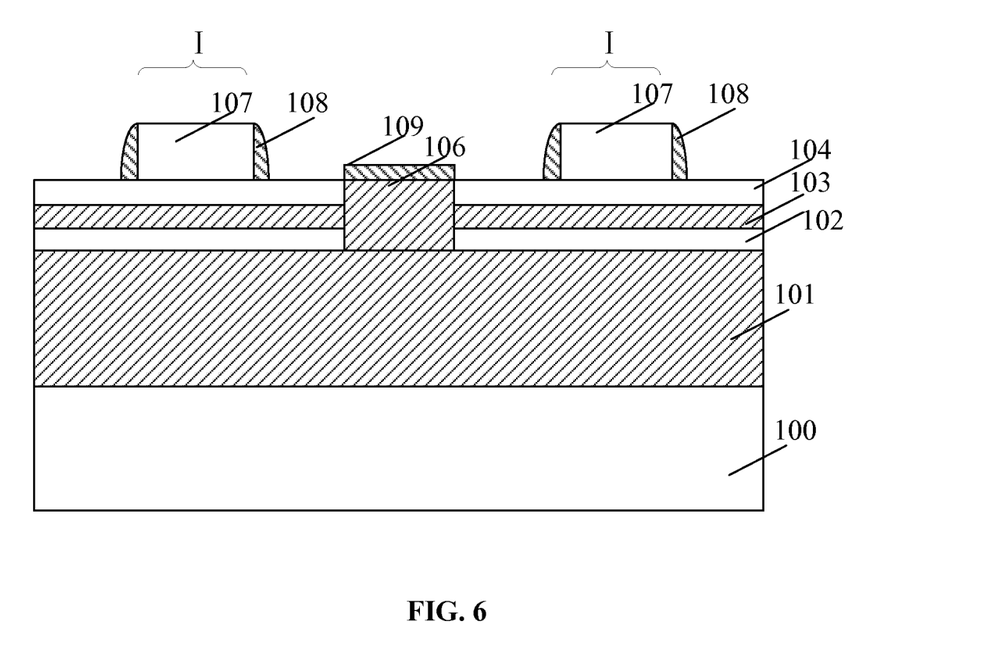

Further, after forming the dummy gate 107, a sidewall spacer 108 may be formed on sidewalls of the dummy gate 107. FIG. 6 illustrates a corresponding semiconductor structure. The sidewall spacer 108 may be made of any appropriate material, such as silicon oxide, or silicon nitride, etc. The sidewall spacer 108 may also be a double-sidewall spacer which may consist of two layers made of different materials. In one embodiment, the sidewall spacer 108 is made of silicon nitride.

Various methods may be used to form the sidewall spacer 108. In one embodiment, the method for forming the sidewall spacer 108 may include sequentially: forming a sidewall spacer material layer on the dummy gate 107, and patterning the sidewall spacer material layer to form the sidewall spacer 108. The sidewall spacer material layer may be patterned by any appropriate process, such as a dry etching process, or a wet chemical etching process, etc.

Referring to FIG. 6, a protective layer 109 may be formed on the isolation structure 106 during the process for forming the sidewall spacer 108. The protective layer may be used to prevent the isolation structure 106 from being damaged by subsequent processes.

The protective layer 109 may be made of a same material as the sidewall spacer 108 by a same process. In one embodiment, the protective layer 109 is made of silicon nitride. The protective layer 109 may also be made of different material than the sidewall spacer 108 with a separated process.

Figure 7:
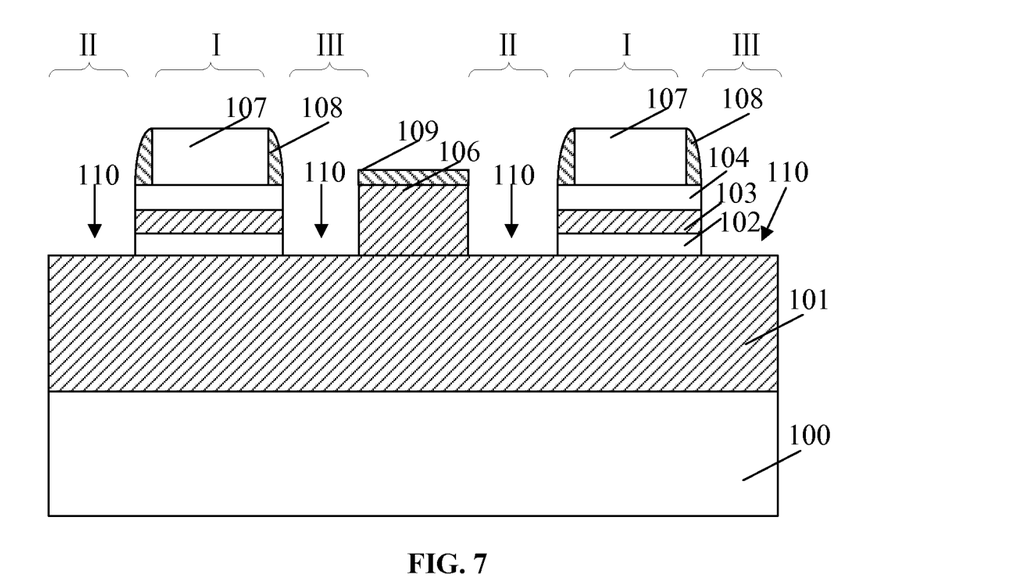

Further, after forming the sidewall spacer 108 and the protective layer 109, trenches 110 may be formed by patterning the capping layer 104, the potential energy barrier layer 103 and the quantum well layer 102 using the dummy gate 107 and the sidewall spacer 108 as a mask. FIG. 7 illustrates a corresponding semiconductor structure.

As shown in FIG. 7, a portion of the capping layer 104, a portion of the energy barrier layer 103 and a portion of the quantum well layer 102 corresponding to the gate region "I" may be kept during the patterning process. A portion of the energy barrier layer 103 and a portion of the quantum well layer corresponding to a source region "II" and a drain region "III" may be removed to form the trenches 110. A portion of the surface of the buffer layer 101 may be exposed by the trenches 110. The trenches 110 may be formed by any appropriate process, such as an ICP etching process, a deep reactive plasma etching process, or an ion beam etching process, etc.

In certain other embodiments, if there is no capping layer 104, the patterning process for forming the trenches 110 may only remove the potential energy layer 103 and the quantum well layer 102.

Figure 8:
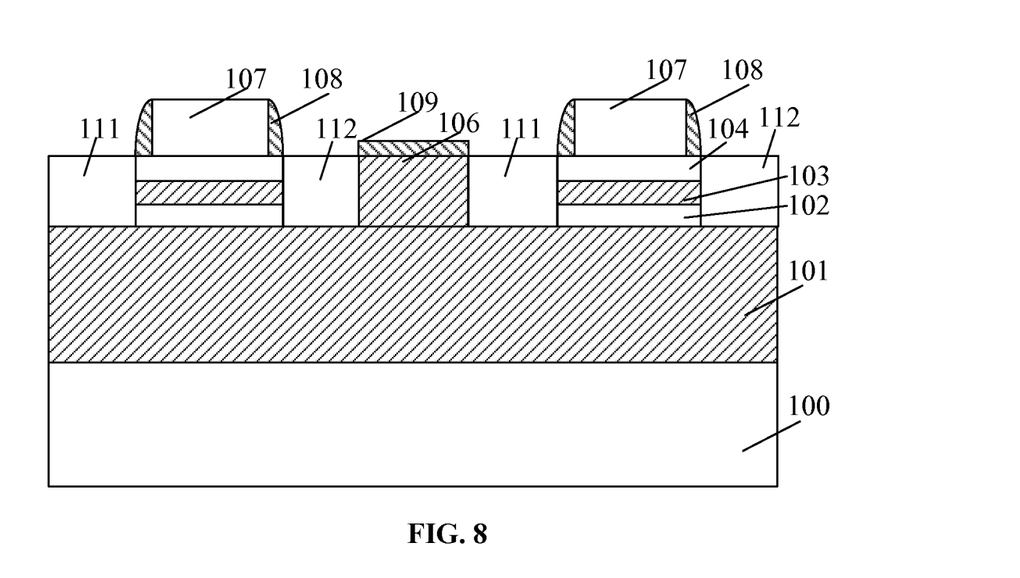

Returning to FIG. 11, after forming the trenches 110, a source and a drain may be formed by filling the trenches 110 with certain material (S5). FIG. 8 illustrates a corresponding semiconductor structure.

As shown in FIG. 8, a source 111 and a drain 112 are formed by filling the trenches 110. Various materials may used to fill the trenches 110 to form the source 111 and the drain 112, such as GaN, AlGaN, GaAs, AlGaAs or InGaN, etc. In embodiment, GaN is used to fill the trenches 110 to form the source 111 and the drain 112.

The source 111 and the drain 112 may be formed by various processes, such as a MOCVD process, an MBE process, or an ALD process, etc. In one embodiment, the source 111 and the drain 112 may be formed by an MBE process. Material for forming the source 111 and the drain region 112 may be in situ doped during the MBE process. For example, if a N-type transistor is needed, the material may be in situ doped with any appropriate N type ions. The N-type doped semiconductor material may be filled into the trenches 110, the source 111 and the drain 112 may be formed.

Returning to FIG. 11, after forming the source 111 and the drain 112, an interlayer dielectric layer with certain structures may be formed (S6). FIGS. 9-10 illustrate corresponding semiconductors.

As shown in FIG. 9, an interlayer dielectric layer 113 (partially shown) may be formed first, followed by patterning the interlayer dielectric layer 113 to form second openings 114. The dummy gate 107 may also be removed to form a first opening 121.

The interlayer dielectric layer 113 may be firstly formed on the source 111, the drain 112 and the isolation structure 106, and may level with the dummy gate 107. The interlayer dielectric layer 113 may be made of any appropriate material, such as silicon oxide, silicon nitride, or silicon oxynitride, etc. In one embodiment, the interlayer dielectric layer 113 is made of silicon oxide.

Various method may used to form the interlayer dielectric layer 113, such as a CVD process, a PVD process, or an ALD process, etc. In one embodiment, the interlayer dielectric layer 113 is formed by plasma enhanced CVD (PECVD) process. After the PECVD process, a chemical mechanical polishing (CMP) process may be performed to cause the interlayer dielectric layer 113 to level with the dummy gate 107.

After forming the interlayer dielectric layer 113 (partially shown), referring to FIG. 9, the dummy gate 107 may be removed to form the first opening 121. The second openings 114 may also be formed by patterning the interlayer dielectric layer 113.

The dummy gate 107 may be removed by any appropriate process, such a dry etching process, or a wet chemical etching process, etc. In one embodiment, if the dummy gate 107 is poly silicon, a wet chemical etching process may be used to remove the dummy gate 107 to form the first opening 121.

A process for forming the second openings 114 may include sequentially: forming a mask on the interlayer dielectric layer 113, and etching portions the interlayer dielectric layer 113 on the source 111 and the drain 112 to form the second openings 114. The mask may be a hard mask, or photo resist mask. An etching process may be a dry etching process, or a wet etching process. In one embodiment, the etching process is a dry etching process.

Further, after forming the first opening 121 and the second openings 114, a gate 119 may be formed on the potential energy layer 104 at the first region "I". FIG. 10 illustrates a corresponding semiconductor structure.

As shown in FIG. 10, the gate 119 is formed in the first opening 121. The gate 119 may have a gate dielectric layer (not shown) made of a high-K dielectric material and a gate layer (not shown) made of a metal material. The gate 119 may be formed by sequentially filling the high-K dielectric material and the metal material in the first opening 121. The gate 119 and the sidewall spacer 108 form a gate structure.

The high-K material may include silicon oxide, hafnium oxide, zirconium oxide, lanthanum oxide, aluminum oxide, titanium oxide, strontium titanate, barium titanate, lanthanum aluminum oxide, yttrium oxide, hafnium oxynitride, zirconium oxynitride, lanthanum oxynitride, aluminum oxynitride, titanium oxynitride, barium strontium oxynitride, lanthanum aluminum oxy nitride, or yttrium oxynitride, etc. The high-K layer may be formed by any appropriate process, such as a CVD process, a PVD process, an ALD process, or a FCVD process, etc.

The metal material layer may include Ni/Au, or Cr/Au, etc. Other appropriate material may also be used as the gate layer, such as tungsten, aluminum, copper, gold, tantalum, vanadium, titanium nitride, zirconium nitride, hafnium nitride, vanadium nitride, niobium nitride, tantalum nitride, tungsten nitride, aluminum titanium nitride, tantalum carbide, tantalum magnesium nitride, or tantalum carbo-nitride, etc. The gate layer may be formed by any appropriate process, such as a CVD process, a PVD process, an ALD process, an FCVD process, or an electroplating process, etc.

Referring to FIG. 10, the metal material may also be filled in the first openings 114 during the process for forming the gate 119, thus interconnection vias 115 may be formed. The interconnection vias 115 may connect with the source region 111 and the drain region 112, and cause the source region 111 and the drain region 112 electrically connect with other devices and/or external circuits.

The interconnection vias 115 may be made of a similar or same material as the gate layer of the gate 119, which may reduce types of materials, thus the production cost may be reduced. The interconnection vias 115 may also be made of different materials than the gate layer of the gate 119 formed by a separated process.

Further, after filling the first opening 121 and the second openings 114 with the metal material, a planarization process may be performed to remove an excess portion of the metal material, and cause the metal material layer to level with the interlayer dielectric layer 113. Thus, the interlayer dielectric layer 113 may function as an isolation layer. The planarization process may include a CMP process, or a mechanical polishing process, etc.

In one embodiment, a dummy gate method is used to pattern the gate 119. The dummy gate method for patterning the gate 119 may include sequentially: forming the dummy gate 107; forming the sidewall spacer 108; removing the dummy gate 107 to form the first opening 121; and filling a metal material to form the gate 119. The dummy gate method may be relatively simple. Further, compared with a method which includes depositing a metal film firstly, followed by patterning the metal film to form the gate 119, the dummy method may only fill the first opening 121 with a metal material, thus less metal material may be used. A price of the metal material such as Ni/Au or Cr/Au may be relatively high, thus a production cost may be lowered by using the dummy gate method to form the gate 119.

Thus, a transistor may be formed by the above disclosed processes and methods, the corresponding transistor is illustrated in FIG. 10. The transistor includes a semiconductor substrate 100 having a thermal conductive and electrical isolation buffer layer 101, and an isolation structure 106 used for isolating different transistor regions. The transistor also includes a quantum well layer 102 on the buffer layer 101, and potential energy barrier layer 103 on the quantum well layer 102. Further, the transistor includes a capping layer on the potential energy barrier layer 103, and a gate structure including a gate 119 and a sidewall spacer 108 on the capping layer 104. Further, the transistor also includes a source 111 and a drain 112 connecting with quantum well layer 102 and the potential barrier layer 103, and interconnection vias 115 connecting with the source 111 and the drain 112. The detailed structures and intermediate structures are described above with respect to the fabrication methods.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a transistor, comprising:
providing a semiconductor substrate;
forming a thermal conductive and electrical isolation buffer layer on the semiconductor substrate;
forming a quantum well layer on the thermal conductive and electrical isolation buffer layer;
forming a potential energy barrier layer on the quantum well layer;
forming an isolation structure to isolate different transistor regions;
patterning the transistor region to form trenches by removing a portion of the quantum well layer and the potential energy barrier layer corresponding to a source region and a drain region;
filling trenches with a semiconductor material to form a source and a drain; and
forming a gate structure on a portion of the quantum well layer and the potential energy barrier layer corresponding to a gate region.

2. The method according to claim 1, after forming the potential energy barrier layer, further including:
forming a capping layer on the potential energy barrier layer.

3. The method according to claim 1, wherein forming the isolation structure further includes:
forming a hard mask layer;
patterning the potential energy barrier layer, the quantum well layer to expose the thermal conductive and electrical isolation buffer layer to form a shallow trench isolation region; and
filling the shallow trench isolation region with a similar material as the thermal conductive and electrical isolation buffer layer using an epitaxial growth method.

4. The method according to claim 1, wherein forming the gate structure further includes:
forming a dummy gate on a portion of the potential energy barrier layer and the quantum well layer corresponding to a gate structure;
forming a sidewall spacer around the dummy gate;
removing the dummy gate to form a first trench; and
filling the first trench sequentially with a gate dielectric layer and a metal gate layer.

5. The method according to claim 4, before forming the gate structure and after forming the source and the drain, further including:
forming an interlayer dielectric layer leveling with the dummy gate.

6. The method according to claim 1, after forming the source and the drain, further including:
forming interconnection vias on the source and the drain to electrically connect with external circuits.

7. The method according to claim 1, wherein:
the quantum well layer is a gallium nitride quantum well layer, an aluminum gallium nitride layer, an indium gallium nitride layer, or a germanium quantum well layer.

8. The method according to claim 1, wherein:
the potential energy barrier layer is made of aluminum nitride.

9. The method according to claim 1, wherein:
the isolation structure is made of aluminum nitride.

10. The method according to claim 1, wherein:
the source and the drain are made of silicon doped gallium nitride.

11. The method according to claim 1, wherein:
the semiconductor substrate is single crystal silicon with a (111) crystal face.

12. A transistor, comprising:
a semiconductor substrate having an isolation structure isolating different transistor regions;
a quantum well layer on the semiconductor substrate in one transistor region;
a potential energy barrier layer on the quantum well layer;
a gate structure on the potential energy barrier layer; and
a source and a drain on the semiconductor substrate at both sides of the gate structure connecting with the quantum well layer and the potential energy barrier layer,
wherein:
the gate structure is formed by sequentially: forming a dummy gate on a portion of the potential energy barrier layer corresponding a gate region; forming a sidewall spacer around the dummy gate; removing the dummy gate to form a first trench; and filling the first trench sequentially with a gate dielectric layer and a metal gate layer; and
the source and the drain are formed by sequentially: forming trenches by removing portions of the quantum well layer and the potential energy barrier layer corresponding to a source region and a drain region using the dummy gate and the sidewall spacer as a mask; and filling the trenches with a semiconductor material.

13. The semiconductor structure according to claim 12, wherein:
thickness of the quantum well layer is in a range of approximately 10 nm~50 nm.

14. The semiconductor structure according to claim 12, wherein:
thickness of the potential energy barrier layer is in a range of approximately 10 nm~50 nm.

15. The semiconductor structure according to claim 12, wherein:
the quantum well layer is a gallium nitride quantum well layer, or an indium gallium nitride quantum well layer, or an aluminum gallium nitride quantum well layer, or a germanium quantum well layer.

16. The semiconductor structure according to claim 12, wherein:
the potential energy barrier layer is made of aluminum nitride.

17. The semiconductor structure according to claim 12, wherein:
the isolation structure is made of aluminum nitride.

18. The semiconductor structure according to claim 12, wherein:
a thermal conductive and electrical isolation buffer layer is formed between the quantum well layer and the semiconductor substrate.

19. The semiconductor structure according to claim 12, wherein:
a capping layer is formed on the potential energy barrier layer.

* * * * *